US008325001B2

(12) United States Patent
Huang et al.

(10) Patent No.: US 8,325,001 B2
(45) Date of Patent: Dec. 4, 2012

(54) INTERLEAVED THREE-DIMENSIONAL ON-CHIP DIFFERENTIAL INDUCTORS AND TRANSFORMERS

(75) Inventors: Daquan Huang, Santa Monica, CA (US); Mau-Chung Frank Chang, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 378 days.

(21) Appl. No.: 11/908,603

(22) PCT Filed: Aug. 2, 2006

(86) PCT No.: PCT/US2006/030382

§ 371 (c)(1),
(2), (4) Date: Mar. 14, 2008

(87) PCT Pub. No.: WO2007/019280

PCT Pub. Date: Feb. 15, 2007

(65) Prior Publication Data

US 2008/0272875 A1 Nov. 6, 2008

Related U.S. Application Data

(60) Provisional application No. 60/705,868, filed on Aug. 4, 2005.

(51) Int. Cl.
*H01F 5/00* (2006.01)
*H01F 27/28* (2006.01)
*H01L 27/08* (2006.01)

(52) U.S. Cl. ......................... 336/200; 336/232; 257/531

(58) Field of Classification Search .................. 336/200, 336/232; 257/531
See application file for complete search history.

(56) References Cited

U.S. PATENT DOCUMENTS

| | | | | |
|---|---|---|---|---|
| 2,762,971 | A * | 9/1956 | Parker | 324/650 |
| 6,577,219 | B2 | 6/2003 | Visser | 336/200 |
| 2001/0033204 | A1 * | 10/2001 | Simburger et al. | 333/24 R |
| 2003/0210122 | A1 * | 11/2003 | Concord et al. | 336/200 |
| 2003/0222750 | A1 * | 12/2003 | Kyriazidou | 336/200 |
| 2004/0075521 | A1 * | 4/2004 | Yu et al. | 336/200 |
| 2004/0108933 | A1 * | 6/2004 | Chen et al. | 336/200 |
| 2004/0108935 | A1 | 6/2004 | Kyriazidou | |
| 2004/0217839 | A1 | 11/2004 | Haaren et al. | 336/200 |

(Continued)

FOREIGN PATENT DOCUMENTS

JP 2002057042 A * 2/2002

OTHER PUBLICATIONS

Chinese Patent Office, The Summary of the Second Office Action, CN Application No. 200600073805, issued May 11, 2011, translation (pp. 1-2) with claims (pp. 3-9), counterpart to U.S. Appl. No. 11/908,603, claiming priority to U.S. Appl. No. 60/705,868, pp. 1-9.

(Continued)

*Primary Examiner* — Mohamad Musleh
*Assistant Examiner* — Tsz Chan
(74) *Attorney, Agent, or Firm* — John P. O'Banion

(57) ABSTRACT

Interleaved three-dimensional (3D) on-chip differential inductors 110, 120 and transformer 100 are disclosed. The interleaved 3D on-chip differential inductors 110, 120 and transformer 100 make the best use of multiple metal layers in mainstream standard processes, such as CMOS, BiCMOS and SiGe technologies.

37 Claims, 12 Drawing Sheets

U.S. PATENT DOCUMENTS

2005/0077992 A1 4/2005 Raghavan et al. ............ 336/200

OTHER PUBLICATIONS

The Korean Intellectual Property Office, Notice of Request for Submission of Argument, KR Application No. 10-2007-7020110, issued Sep. 21, 2012, translation (pp. 1-2) with claims examined (pp. 3-7), counterpart to this application U.S. Appl. No. 11/908,603, pp. 1-11. The reference cited therein, US 2004/0108935 A1, corresponds to U.S. Appl. No. 10/727,431 which is a continuation of U.S. Appl. No. 10/161,518. U.S. Appl. No. 10/161,518 published as US 2003/0222750 A1 which has already been cited and considered by the examiner herein.

* cited by examiner

INTERLEAVED THREE-DIMENSIONAL ON-CHIP DIFFERENTIAL INDUCTORS AND TRANSFORMERS

CROSS REFERENCE TO RELATED APPLICATION

This application claims the benefit of U.S. provisional patent application Ser. No. 60/705,868, filed Aug. 4, 2005 for a "Interleaved 3D On-Chip Differential Inductor and Transformer" by Daquan Huang and Mau-Chung F. Chang, the disclosure of which is incorporated herein by reference for all purposes permitted by law and regulation.

STATEMENT REGARDING FEDERALLY SPONSORED RESEARCH OR DEVELOPMENT

This invention was made with Government support of Grant No. N66001-04-1-8934, awarded by the U.S. Navy. The Government has certain rights in this invention.

FIELD

The present disclosure relates to inductors and transformers. In particular, it relates to improved on-chip inductors and transformers and methods of making the same.

BACKGROUND

On-chip inductors and transformers are key passive components in radio frequency/millimeter wave integrated circuits (RF/MMICs). On-chip differential inductors are highly desirable for any circuits with differential structures, such as amplifiers, mixers, voltage controlled oscillators (VCOs), and phase-locked loops (PLLs)/synthesizers, frequency dividers and many others.

Some known on-chip inductor and transformer devices include:

(1) Single-ended multi-layer on-chip inductors;

(2) Planar on-chip differential inductors which do not use multiple metal layers;

(3) Planar on-chip transformers which do not use multiple metal layers;

(4) Multilayer balun transformers realizing single-ended to balanced conversion.

U.S. Pat. No. 6,759,937 B2 to Kyriazidou discloses an on-chip differential multi-layer inductor that in one embodiment includes a first partial winding on a first layer, a second partial winding on the first layer, a third partial winding on a second layer, a fourth partial winding on the second layer, and an interconnecting structure. The first and second partial windings on the first layer are operably coupled to receive a differential input signal. The third and fourth partial windings on the second layer are each operably coupled to a center tap. The interconnecting structure couples the first, second, third and fourth partial windings such that the first and third partial windings form a winding that is symmetrical about the center tap with a winding formed by the second and fourth partial windings. The first, second, third and fourth partial windings are for the most part, but not entirely vertically aligned and not symmetric about a center line (see FIGS. 4 for the multiple layer differential inductor embodiment and 6 for another embodiment, the multiple turn, multiple layer differential inductor). In inductors, what is needed is magnetic coupling instead of electrical coupling between the windings. Vertical alignment makes the electrical coupling high through the capacitance between windings.

U.S. Pat. No. 6,707,367 B2 to Castaneda, et al. discloses an on-chip multiple tap transformed balun that includes a first winding and a second winding having two portions. Castaneda et al. disclose a single-layer structure in which multiple windings are placed on the same layer. This type of structure has a relatively large size. Cost and the low self resonant frequency are issues due to the large size. The large size is expensive because chip real estate is expensive. For this reason, much effort has been devoted to shrinking the technology from micron to sub-micron to deep sub-micron scales.

U.S. Pat. No. 6,603,383 to Gevorgian, et al. discloses a multilayer, balanced-unbalanced signal transformer comprising a first coil and a second coil providing at least one balanced signal port at one side of the balun transformer and an unbalanced signal port at another side of the balun transformer. The windings of the coils are vertically aligned. In transformers, what is needed is magnetic coupling instead of electrical coupling between the primary and the secondary coils. Vertical alignment makes the electrical coupling high through the capacitance between windings.

Although the devices disclosed in the patents mentioned above offer advantages, they may still be improved upon. For instance, the device disclosed in the '367 patent uses multiple windings on the same layer (called a single-layer structure). The relatively large size of this device raises issues of cost and low self resonant frequency. The devices of the '383 and '937 patents use windings that are vertically aligned. However, in transformers magnetic coupling is preferable over electrical coupling between the primary and the secondary coils, but vertical alignment results in high electrical coupling due to the capacitance between windings.

It is desirable to design and fabricate on-chip inductors and transformers with characteristics of small size, high quality factor (Q factor), large inductance, high coupling efficiency and high self-resonating frequency that are improved from the references and the known devices described above. In silicon based integrated circuits where the substrate is lossy, it is especially important to make on-chip inductors and transformers consume as little real estate as possible, because large inductor/transformer area induces large parasitic capacitance between the on-chip inductor/transformer and the substrate that not only picks up undesired noise from other parts of circuit through a silicon substrate but also severely limits the self-resonating frequency of the on-chip inductor and transformer.

SUMMARY

The devices and methods disclosed below achieve these goals. By fully interleaving the windings, the embodiments disclosed reduce the electrical coupling yet increase the magnetic coupling by sharing the some core between the primary and the secondary coils through inductive coupling.

Interleaved three-dimensional (3D) on-chip differential inductors and transformers are disclosed. The interleaved 3D on-chip differential inductors and transformers make the best use of multiple metal layers in mainstream standard processes, such as CMOS, BiCMOS and SiGe technologies.

By separating each turn of a coil into two partial windings and placing them interleaved in different layers, interleaved 3D on-chip differential inductors and transformers are provided with minimized size, decreased parasitic capacitances, higher self-resonating frequencies, increased mutual inductances, higher coupling efficiency, and higher Q factor.

The 3D on-chip differential inductors and transformers disclosed herein have a plurality of coils that are "interleaved"

in order to separate adjacent windings as much as possible in order to reduce parasitic capacitance. The meaning of "interleaved" as used in this specification (and differing from that of dictionaries) refers to a configuration of at least two coils sharing a common axis (arbitrarily chosen as the vertical direction) and running generally parallel to each other in which adjacent partial windings of the coils are separated both vertically as well as horizontally in order to reduce parasitic capacitance.

In a further aspect of the interleaved 3D on-chip differential inductors and transformers disclosed herein, an inductive 3D on-chip apparatus is provided comprising a first coil and a second coil, the first and second coils each comprising successively connected windings centered on a common axis, wherein the windings of the first coil are interleaved with adjacent windings of the second coil.

In another aspect of the interleaved 3D on-chip differential inductors and transformers disclosed herein, an interleaved three dimensional on-chip differential inductor is provided, comprising first and second coils formed on a plurality of layers on a chip and sharing a common alignment axis, each of the first and second coils comprising a plurality of partial windings wherein each partial winding is disposed on a layer with connections between successive partial windings of each of the first and second coils passing through the layers; and wherein the partial windings of the first and second coils are generally perpendicular to the common alignment axis and are interleaved.

In yet another aspect of the interleaved 3D on-chip differential inductors and transformers disclosed herein, an interleaved three dimensional on-chip transformer is provided, comprising; first and second coils formed on a plurality of layers on a chip and sharing a common alignment axis, each of the first and second coils comprising a plurality of partial windings wherein each partial winding is disposed on a layer with connections between successive partial windings of each of the first and second coils passing through the layers separating the successive partial windings of each of the first and second coils; wherein the partial windings of the first and second coils are generally perpendicular to the common alignment axis and are interleaved; third and fourth coils formed on the plurality of layers of the chip and sharing the common alignment axis, each of the third and fourth coils comprising a plurality of partial windings wherein each partial winding is disposed on a layer with connections between successive partial windings of each of the third and fourth coils passing through the layers separating the successive windings of each of the third and fourth coils; and wherein the partial windings of the third and fourth coils are generally perpendicular to the common alignment axis and are interleaved.

In a further aspect of the interleaved 3D on-chip differential inductors and transformers disclosed herein, a method for making three-dimensional on-chip differential inductors is provided, comprising forming a substrate in successive layers on a chip; disposing two partial windings on each layer, the partial windings having a common axis and forming the shape of a simple polygon or a simple closed curve; connecting each of the partial windings disposed on one of the layers to one of the partial windings of an adjacent layer; wherein the partial windings of one layer are disposed so as to be interleaved with the partial windings of adjacent layers.

BRIEF DESCRIPTION OF DRAWINGS

The present disclosure will be understood and appreciated more fully from the following detailed description taken in conjunction with the drawings. The drawings are described below.

DETAILED DESCRIPTION OF PREFERRED EMBODIMENTS

In accordance with the present disclosure, interleaved 3D on-chip differential inductors and transformers are provided.

The interleaved 3D on-chip differential inductors and the interleaved on-chip transformers described are manufactured by standard processes well known to those of skill in the art, such as Complementary Metal Oxide Semiconductor (CMOS), integration of bipolar junction transistor and CMOS technology (BiCMOS), and Silicon-Germanium (SiGe) technologies.

The interleaved 3D on-chip differential inductors and the interleaved on-chip transformers described below are manufactured in layers containing the windings. Windings are patterned, deposited or otherwise placed on the layers as the layers are built up. The windings are connected between the layers by vias.

Figure 1:
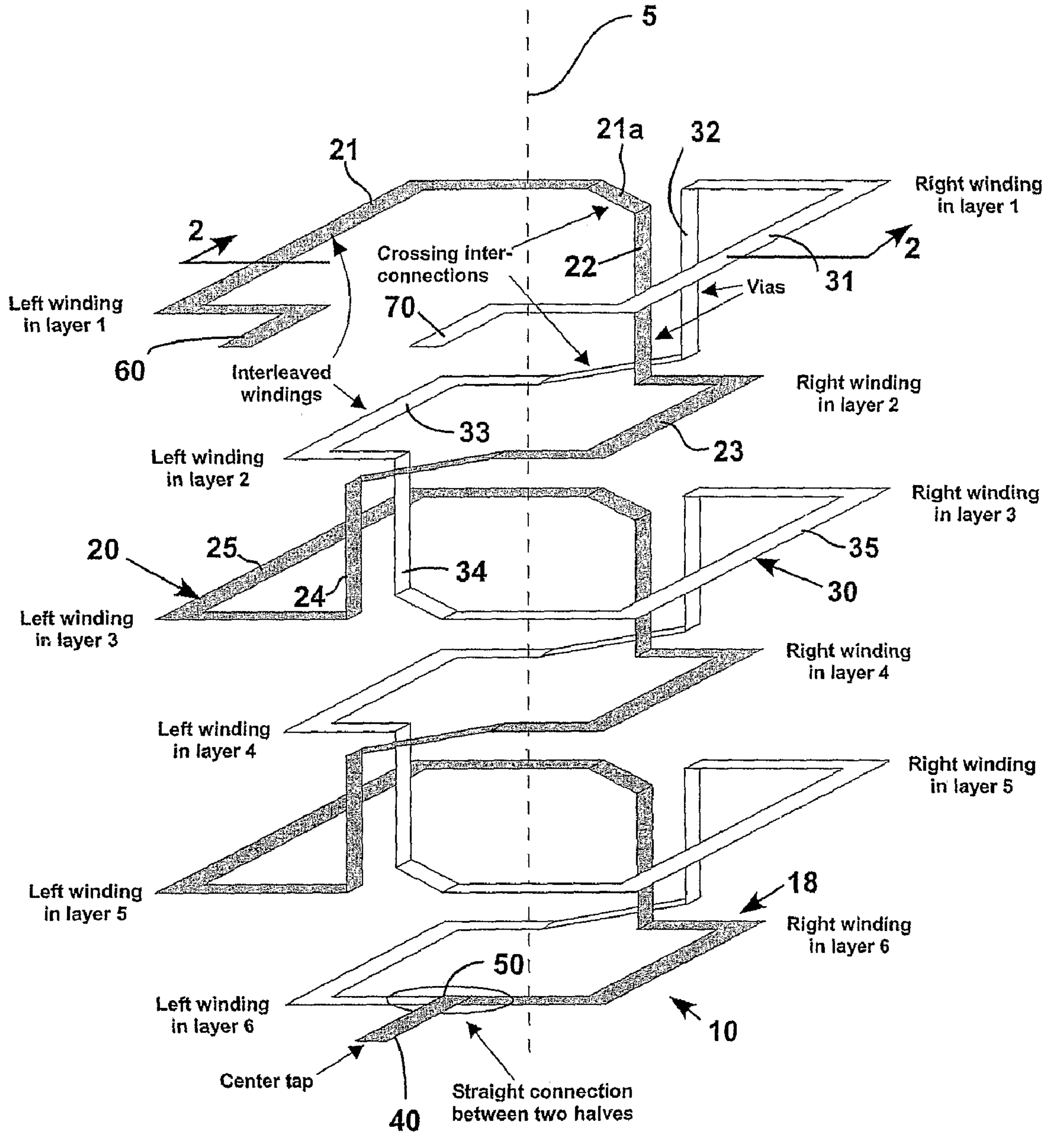
FIG. 1 is an isometric view of a schematic of a preferred embodiment of an interleaved on-chip differential inductor.
Figure 2:
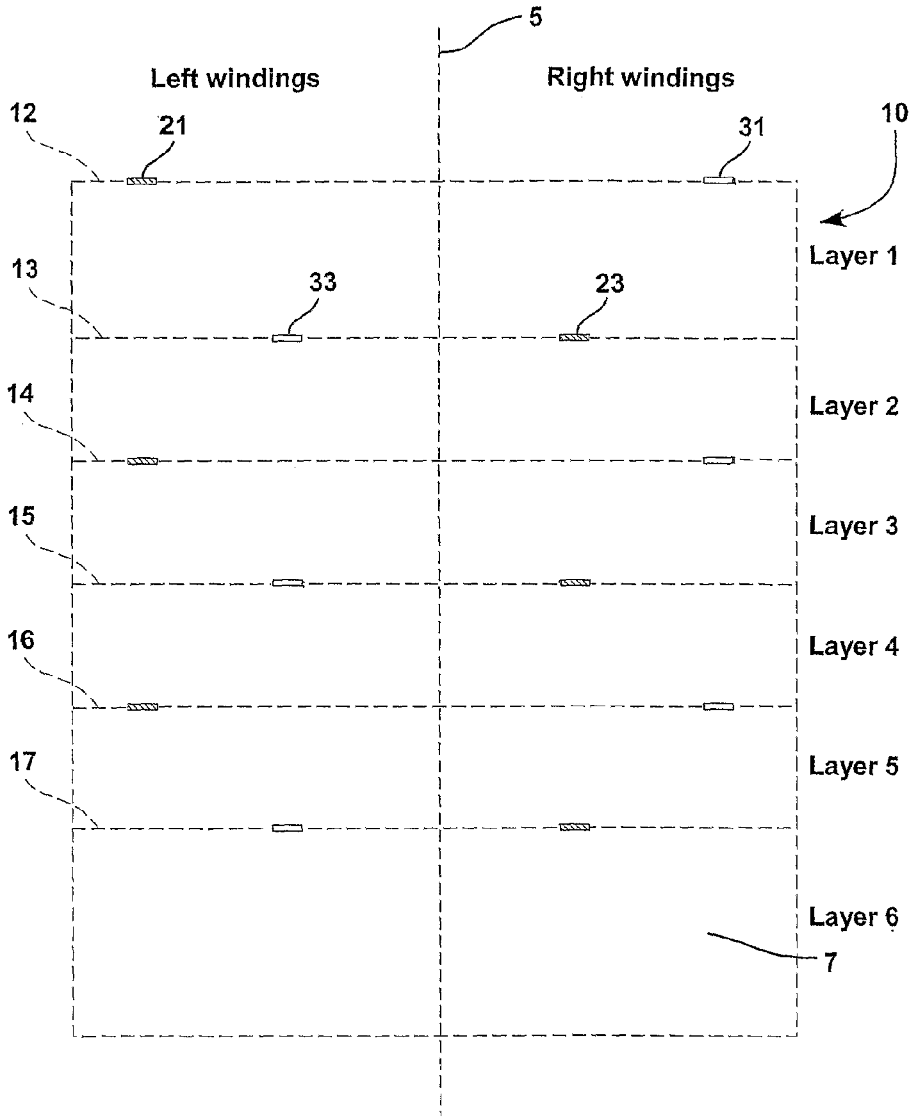
FIG. 2 is a section view of the interleaved on-chip differential inductor of FIG. 1 taken along the plane 2-2 as shown in FIG. 1. The substrate is shown in broken line to emphasize the windings.

FIG. 1 shows a perspective schematic of a preferred embodiment of the interleaved on-chip differential inductor, identified generally by reference numeral 10. FIG. 2 shows a sectional view and FIG. 3 a schematic of an end view of the interleaved on-chip differential inductor 10 shown in FIG. 1. It will be noted that information behind the section plane is deleted in FIG. 2 in order to make the view easier to understand.

The interleaved on-chip differential inductor 10 shown in FIG. 1 is located on or associated with six layers of a generally non-conductive substrate built on top of a chip (thus "on-chip") made of a semiconductor such as p-type silicon (depending on the chip-making technology employed). The interleaved on-chip differential inductor 10 contains a first coil 20 and a second coil 30 joined at the bottom by a center tap 40 and a straight connection 50. The first coil 20 has a port 60 and the second coil 30 has a port 70 at the top. The first coil 20 and the second coil 30 are joined at a bottom layer 17 by a straight connection 50 and the center tap 40.

The coils 20 and 30 are formed from conductive partial windings horizontally disposed on sequenced layers of a substrate 7 (see FIG. 2). The substrate 7, it will be understood, preferably is a generally non-conductive or dielectric material such as silicon dioxide. The conductive partial windings may be made of a metal such as aluminum, copper, and gold. The partial windings on different layers are connected by vias that run vertically through the layers. (In this specification "horizontal" means along or parallel to a layer and "vertical" means perpendicular to a layer.) The vias preferably will be made of the same conductive material, such as a metal, as the conductive partial windings.

The actual number of layers is determined by the application. It is not limited to six and may be less than six.

Figure 3:
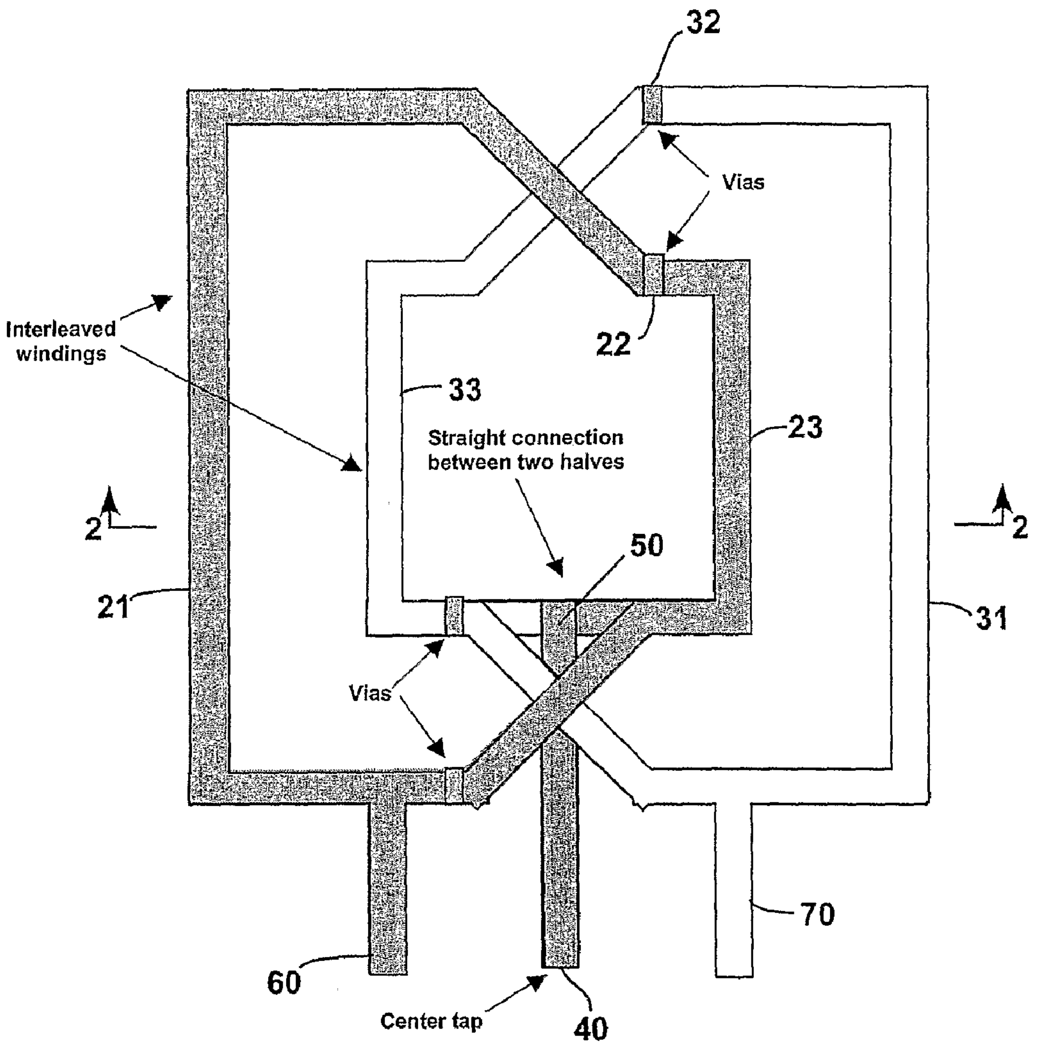
FIG. 3 is an end view of the schematic of the interleaved on-chip differential inductor of FIG. 1, in which the substrate is treated as if it was invisible.

Each of the coils 20 and 30 of the preferred embodiment of the differential inductor shown in FIGS. 1-3 is formed of alternating partial windings, a "left" partial winding being followed by a "right" partial winding, and vice versa, on successive layers connected by vias. (The terms "left" and "right" merely refer to the positions of the partial windings as seen in FIG. 1.) Thus, the first coil 20 has a "left" or first partial winding 21 on the first layer 12 connected by a via 22 to a "right" or second partial winding 23 on the second layer 13. The right partial winding 23 is connected by a via 24 to a "left" or third partial winding 25 on the third layer 14 and so on. The second coil 30 has a "right" or first partial winding 31 on the first layer 12 connected by a via 32 to a "left" or second partial winding 33 on the second layer 13. The left partial winding 33 is connected by a via 34 to a "right" or third partial winding 35 on the third layer 14 and so on.

Each set of a "left" partial winding and a "right" partial winding on a layer has, when seen from above or below, the general appearance of the outline of a simple polygon or other shape having a perimeter such as a simple closed curve. As shown in FIG. 3, the shape is generally that of a square, apart from crossing interconnection segments of the partial windings such as crossing interconnection subsegment 21*a* of the left partial winding 21. It will be understood that the "left" partial winding and a "right" partial winding of each layer are not connected except at the bottom layer 17 (layer six in the embodiment shown in FIGS. 1-3) where the straight connection 50 between the two "halves" (coils 20 and 30) of the differential inductor 10 is to be found.

On the first layer 12 the "left" or first partial winding 21 of the first coil 20 and the "right" or first partial winding 31 of the second coil 30 form, when seen from above in FIG. 3, a square having a greater average diameter than the square formed on the second layer 14 by the "left" partial winding 33 of the second coil 30 and the "right" partial winding 23 of the first coil 20. Another way of stating this change is to say that the partial windings in the first layer 12 are disposed farther from an imaginary vertical axis of alignment 5 than are the partial windings in the second layer 13 (ignoring the crossing interconnection subsegments). Yet another way of stating this change is to observe that the partial windings on the first layer 12 form a simple polygon or other shape having a perimeter such as a simple closed curve that has a greater area than that of the second layer 13.

As a result, the partial windings 23 and 33 on the second layer 13 are staggered or displaced horizontally inward compared to the partial windings 21 and 31 on the first layer 12, as well as being separated vertically as a result of being located on different layers. The partial windings 25 and 35 on the third layer 14 are in turn staggered or displaced horizontally outward compared to the partial windings 23 and 33 on the second layer 13. This is best seen in FIG. 2. The partial windings of the differential inductor shown in FIGS. 1-3 are therefore interleaved both horizontally as well as vertically.

The distance between the partial windings on two adjacent layers is greater compared to known configurations in which the windings on the different layers are vertically aligned, one above the other, and are therefore closer to each other because they are separated by only the thickness of the layer.

Interleaving may be explained in the context of two on-chip coils, such as those shown in the embodiment of FIGS. 1-3, as follows. Each coil has at least one turn. Each turn of a coil comprises two partial-windings. A partial-winding from a first coil is located on a first level as a partial winding from a second coil and another partial-winding from the first coil is located on a second level with another partial-winding from the second coil, the partial windings of each coil being joined by vertical components or vias, so that the first and second coils spiral about the same axis in a double helix configuration.

The vertically separated partial windings of the first and the second coils are also offset horizontally from each other. Thus, partial windings of a first general diameter are alternated with partial windings of second general diameter that is different from the first general diameter. Adjacent partial windings are separated both vertically as well as horizontally in order to reduce parasitic capacitance.

A first preferred embodiment of an interleaved 3-D on-chip transformer, indicated by reference numeral 100, is shown in FIGS. 4A-6B. The transformer 100 comprises two differential inductors 110 and 120 and therefore has four coils 130, 140, 150, and 160, each with its own port 132, 142, 152, and 162, respectively, at the top. The coils 130 and 140 are part of the differential inductor 110 and the coils 150 and 160 are part of the differential inductor 120.

Figure 5:
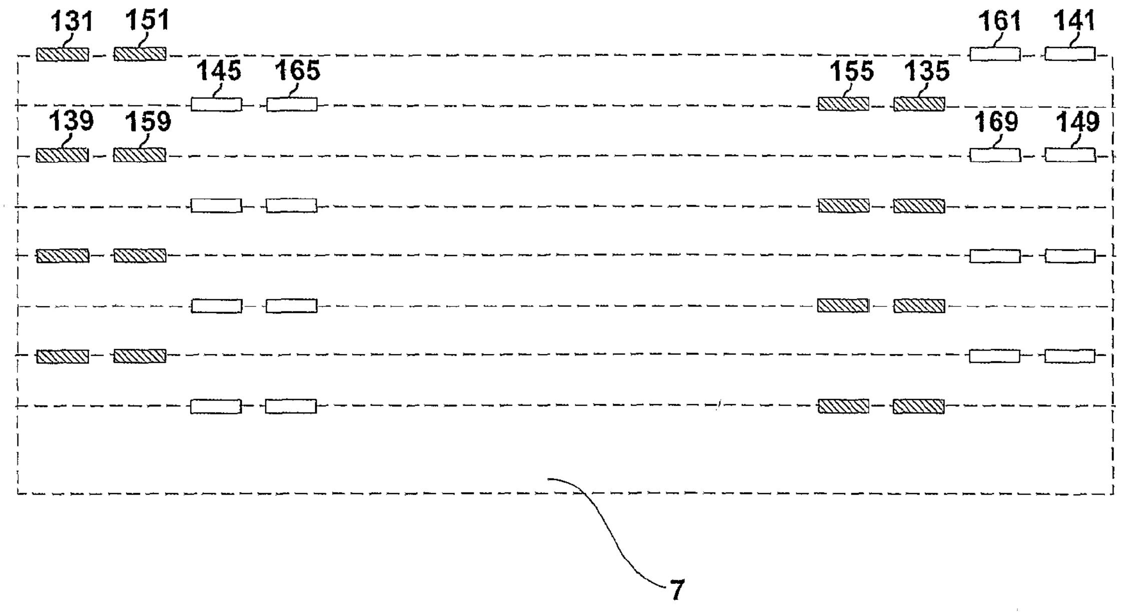
FIG. 5 is a section view of the interleaved on-chip transformer of FIGS. 4A and 4B taken along the plane 5-5 as shown in FIGS. 4A and 4B.
Figure 6A:
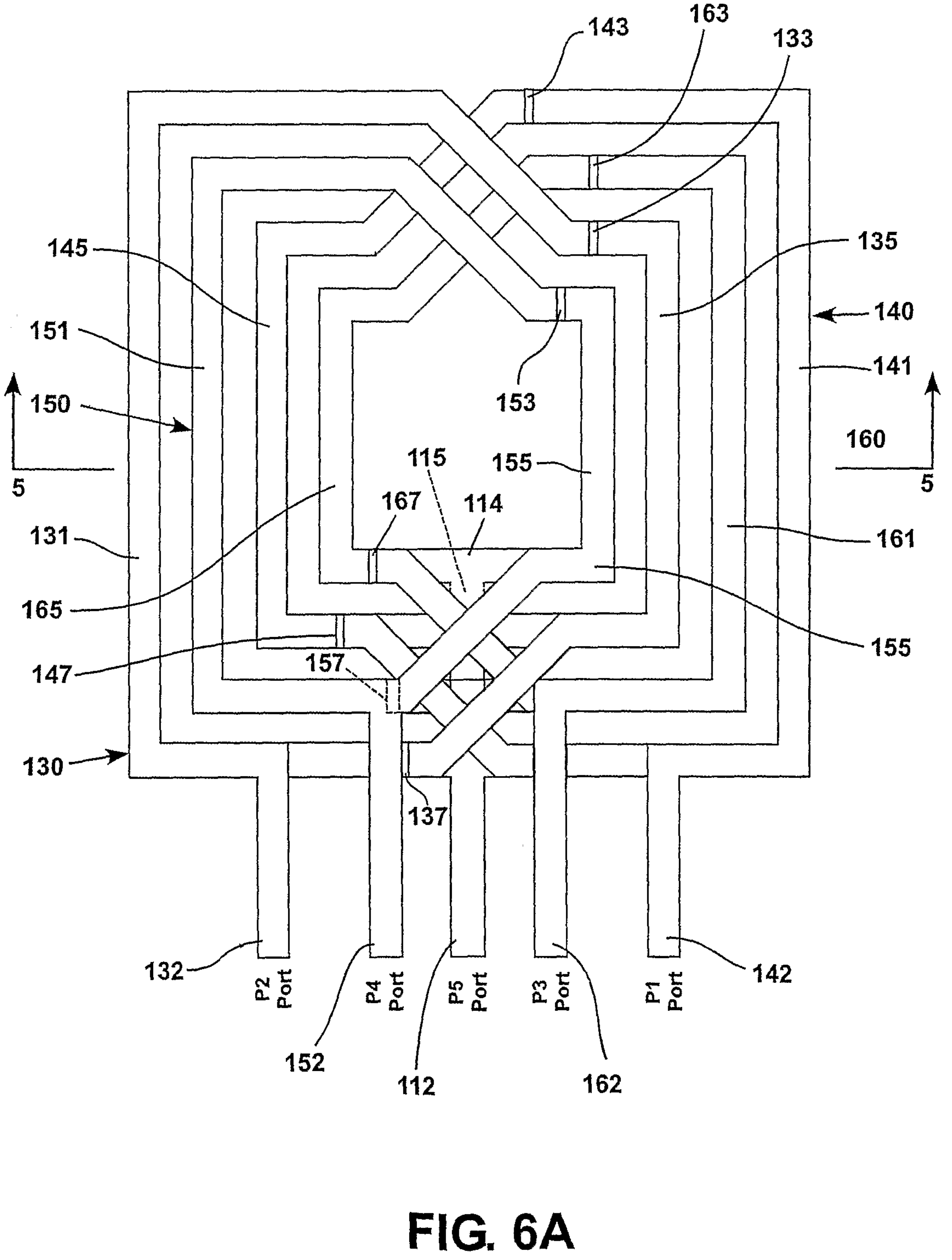
FIGS. 6A and 6B are end views of the schematics of the interleaved on-chip transformers of FIGS. 4A and 4B in which the substrate is treated as if it was invisible.
Figure 6B:
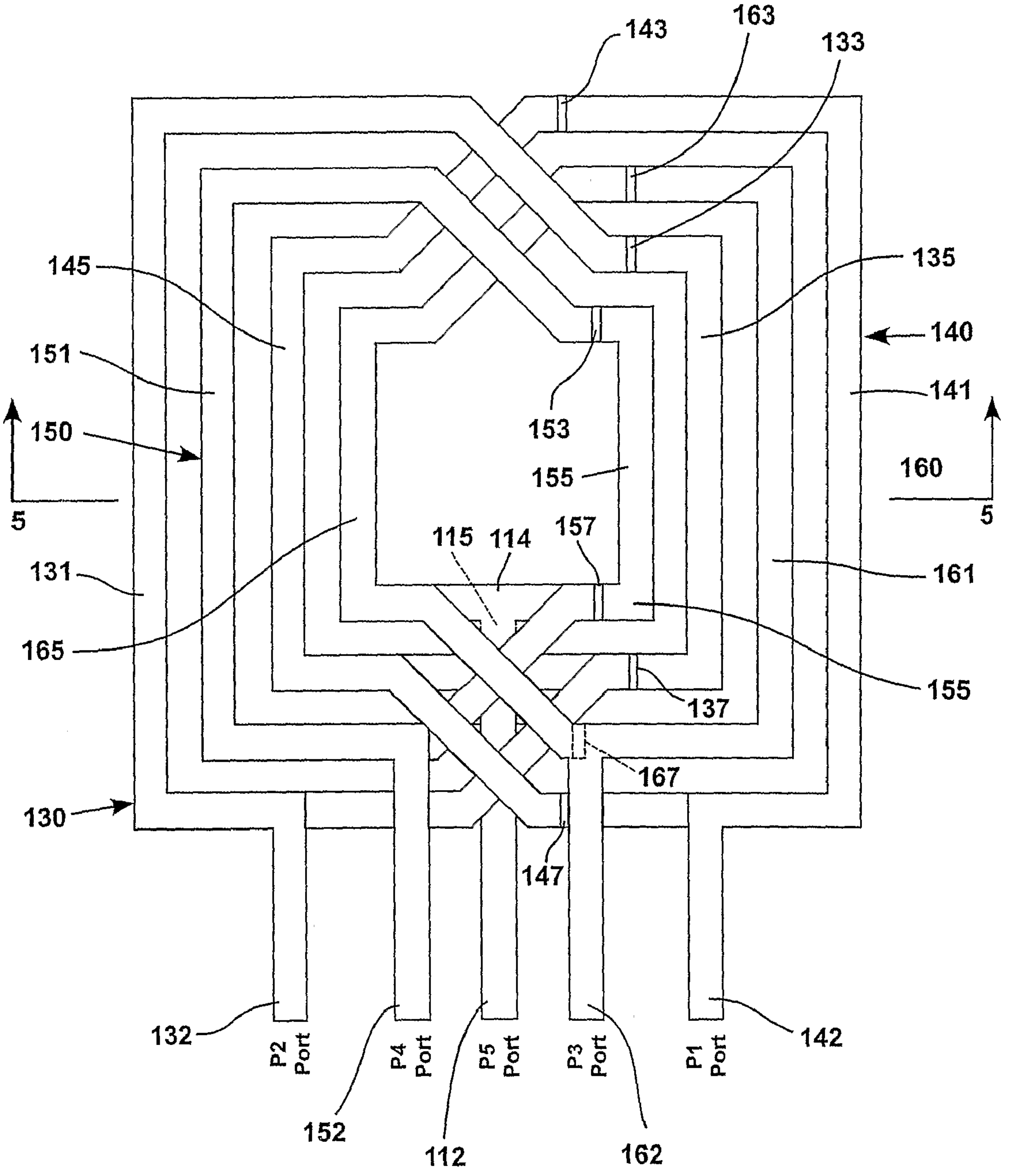

As with the differential inductor 10, the coils 130, 140, 150, and 160 of the transformer 100 are formed from conductive partial windings horizontally disposed on sequenced layers of a generally non-conductive substrate 7 built on a chip (see FIG. 5). The partial windings on different layers are connected by conductive vias that run vertically between the layers.

The coils 130 and 140, and 150 and 160, respectively, are joined at their respective bottom partial windings by the straight connections 114 and 124 joined to the center taps 112 and 122. The interleaved on-chip transformer 100 tightly couples the differential inductor pair 110 and 120 and thus inherently provides phase coherent characteristics.

The straight connections 114 and 124 may be connected by conductive bridge 115 (shown in dashed line in FIGS. 4A and 4B) so that the center taps 112 and 124 become the same port and the transformer 100 will be a five-port transformer rather than a six-port transformer, as is required in some circuits in which the primary and the secondary coils of the transformer can share the common center tap.

Each of the coils 130, 140, 150, and 160 of the preferred embodiment of the transformer shown in FIGS. 4A-6B is formed of alternating partial windings, a "left" or first partial winding being followed by a "right" or second partial winding, and vice versa, on successive layers connected by vias.

Figure 4A:
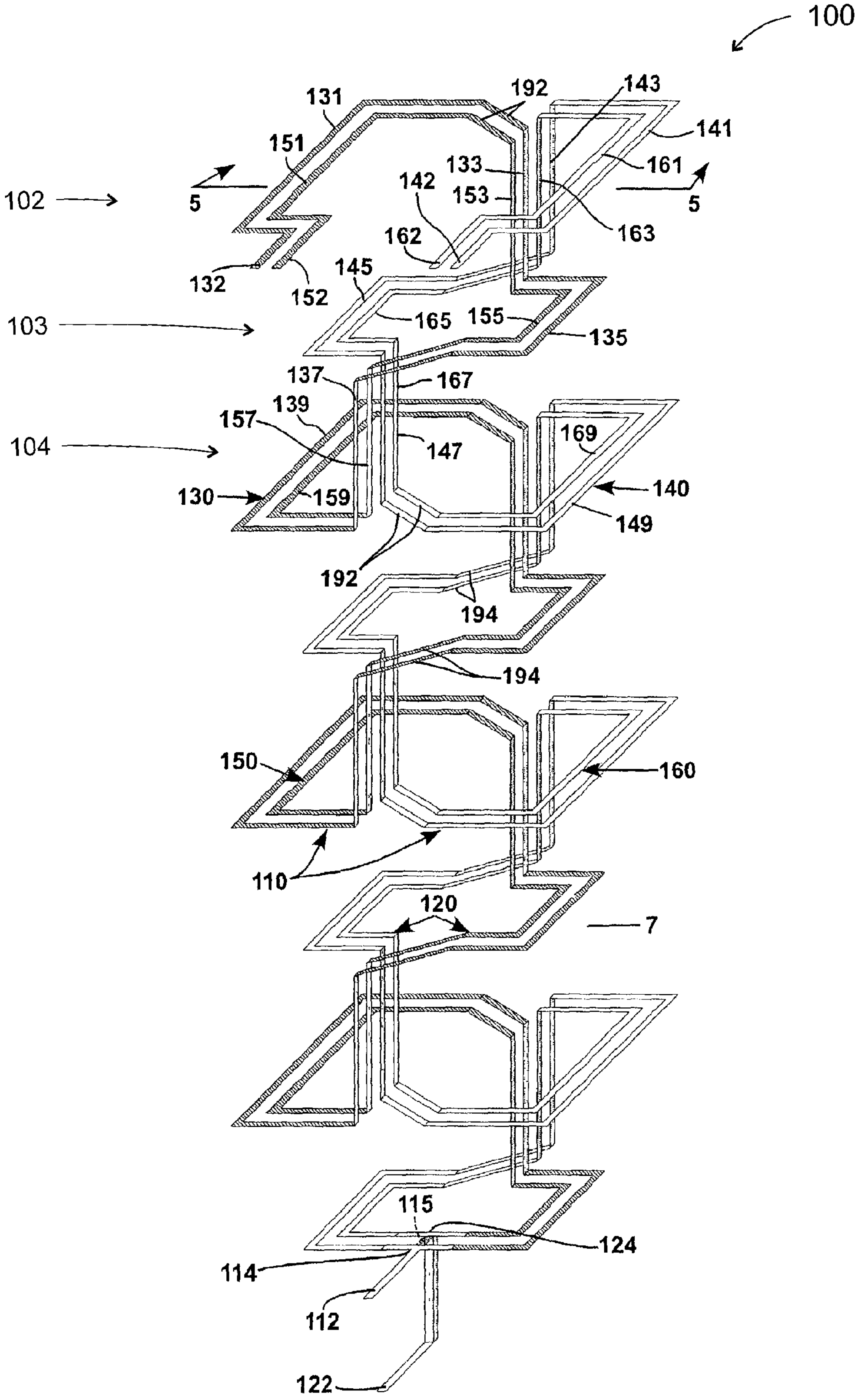
FIGS. 4(*a*) and (*b*) are isometric views of two versions of a first preferred embodiment of a interleaved 3D on-chip transformer, in which the transformer comprises two interleaved differential inductors.
Figure 4B:
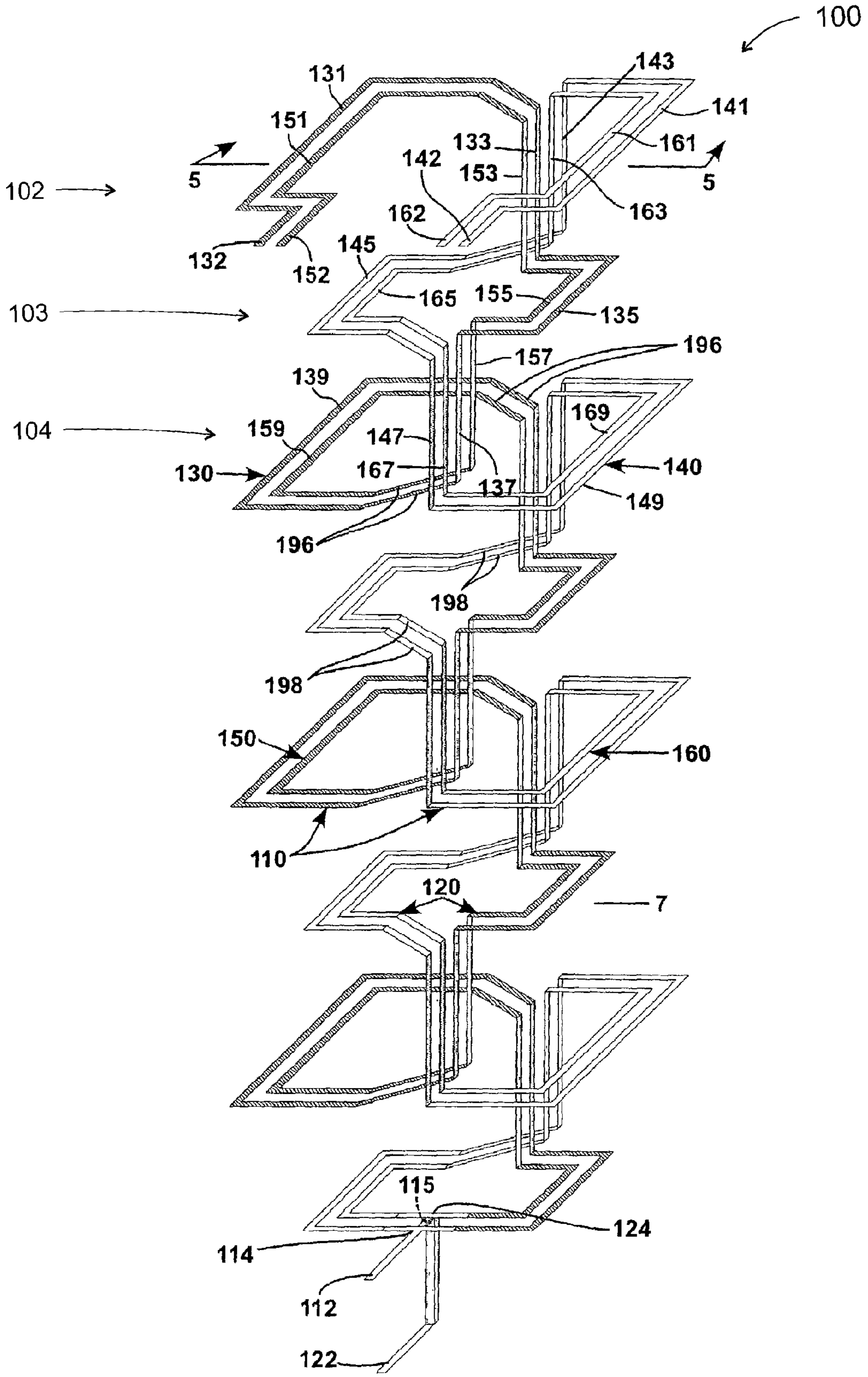

(The terms "left" and "right" merely refer to the positions of the partial windings as seen in FIGS. 4A and 4B.)

Thus, the first coil of the differential inductor 110, the coil 130, has a "left" or first partial winding 131 on the first layer 102 connected by a via 133 to a "right" or second partial winding 135 on the second layer 103. The right partial winding 135 is connected by a via 137 to a "left" or third partial winding 139 on the third layer 104 and so on. The second coil of the differential inductor 110, the second coil 140, has a "right" or first partial winding 141 on the first layer 102 connected by a via 143 to a "left" or second partial winding 145 on the second layer 103. The left partial winding 145 is connected by a via 147 to a "right" or third partial winding 149 on the third layer 104 and so on.

Thus, the first coil of the differential inductor 120, the coil 150, has a "left" or first partial winding 151 on the first layer 102 connected by a via 153 to a "right" or second partial winding 155 on the second layer 103. The right partial winding 155 is connected by a via 157 to a "left" or third partial winding 159 on the third layer 104 and so on. The second coil of the differential inductor 120, the second coil 160, has a "right" or first partial winding 161 on the first layer 102 connected by a via 163 to a "left" or second partial winding 165 on the second layer 103. The left partial winding 165 is connected by a via 167 to a "right" or third partial winding 169 on the third layer 104 and so on.

The partial windings of each differential inductor in this embodiment are displaced horizontally compared to the partial windings of the same differential inductor in the immediately superior and inferior layers, as in the differential inductor described in connection with FIGS. 1-3. The horizontal displacement is best seen in FIG. 5.

The embodiment of a transformer shown in FIG. 4B is currently preferred to that of FIG. 4A because simulations show that it has better performance in terms of the symmetry, resulting in less mismatching between the two partial windings. The embodiment of FIG. 4A has crossing interconnections where each set of partial windings on a layer veer in (crossing interconnections 192) or out (crossing interconnections 194) on alternate layers in order to avoid vias of the other two partial windings. In FIG. 4B these interconnections 196 and 198 are formed in the left side partial windings only and alternatively both veer in and out, respectively, on successive layers in which the partial windings form a large area simple polygon or simple curved perimeter or other perimeter followed by a small area simple polygon or simple curved perimeter or other perimeter.

Figure 7:
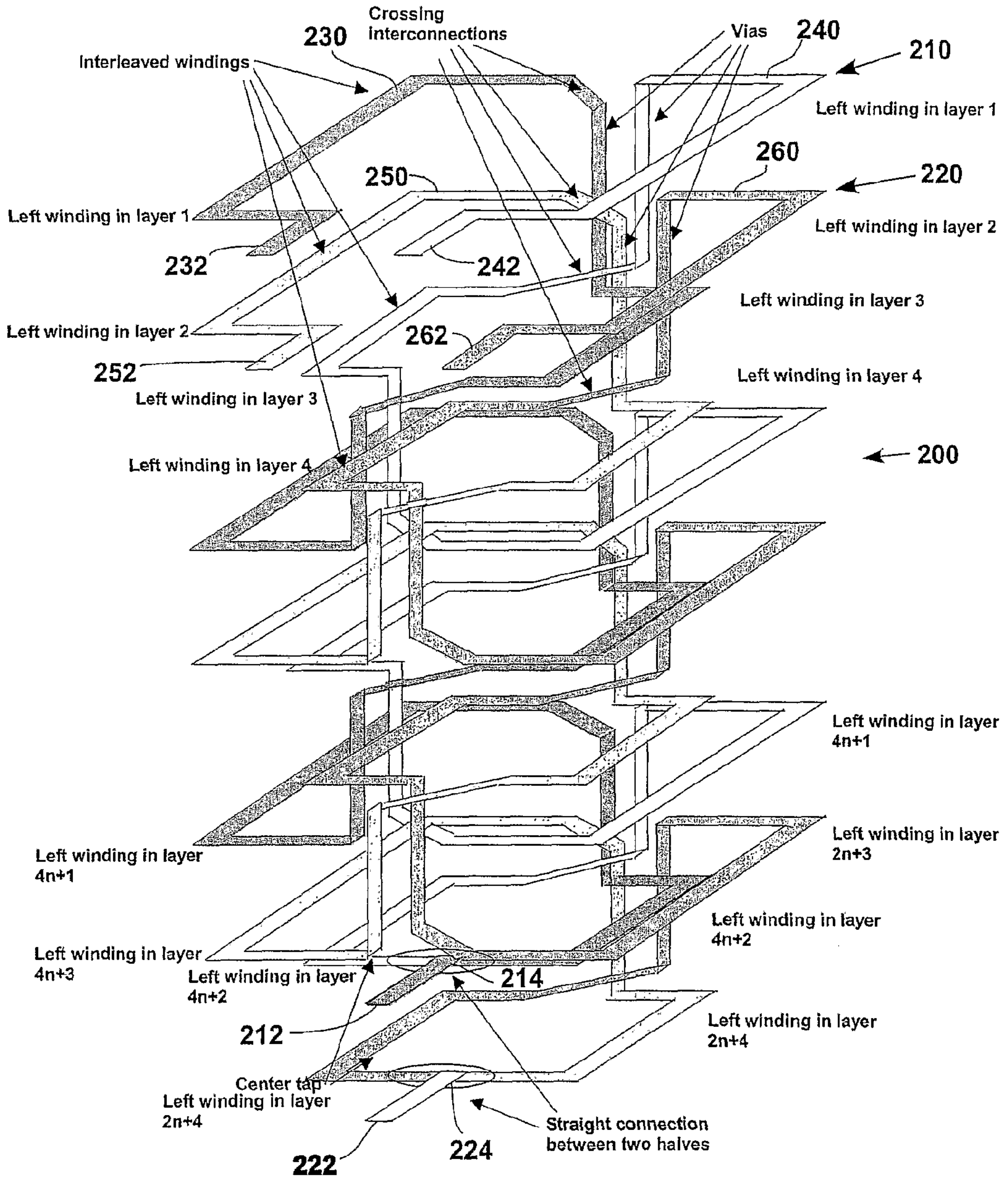
FIG. 7 is an isometric view of a schematic of a second preferred embodiment of an interleaved 3D on-chip transformer, in which the transformer comprises two interleaved differential inductors.

A second preferred embodiment of an interleaved transformer, indicated by reference numeral 200, is shown in FIG. 7. The transformer 200 comprises two differential inductors 210 and 220. The differential inductor 210 has coils 230 and 240. The differential inductor 220 has the coils 250 and 260. The coils 230, 240, 250, and 260 each have its own port 232, 242, 252, and 262, respectively, at its respective top partial winding.

The coils 230 and 240, and 250 and 260, respectively, are joined at their respective bottom layers by straight connections 214 and 224 connected to center taps 212 and 222. The interleaved on-chip transformer 200 tightly couples the differential inductor pair 210 and 220 and thus inherently provides phase coherent characteristics.

The straight connections 214 and 224 may be connected by a conductive bridge (not shown) so that the center taps 212 and 222 become the same port and the transformer 200 will be a five-port transformer rather than a six-port transformer.

The interleaving due to variation in the general diameter of the polygons or perimeters such as simple closed curves formed by the partial windings may be between sets of two layers as shown in FIG. 7, in which the sets of two layers correspond to paired windings of the two differential inductors 210 and 220. Thus, the first layer layers 1 and 2 would each have the same or a similar general diameter of the simple polygon or perimeters such as simple closed curves formed by the partial windings and this general diameter would be less than the general diameter of the simple polygon or simple closed curve or other perimeter formed by the partial windings on layers 3 and 4. Layers 5 and 6 have partial windings forming a simple polygon or simple closed curve or other perimeter of general diameter greater than that of layers 3 and 4, and so on.

The embodiment of the 3D on-chip transformer shown in FIG. 7 has the advantage that the partial windings of a given differential inductor are separated by an even greater distance vertically for a given layer thickness, thus helping to reduce parasitic capacitance.

Figure 8:
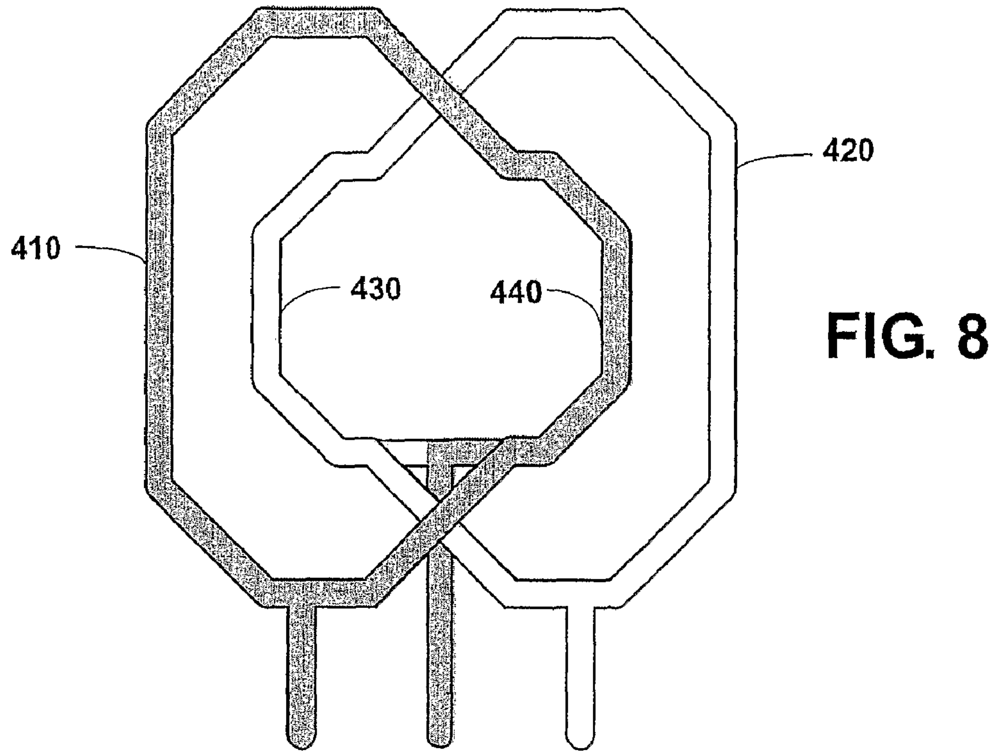
FIGS. 8 and 9 show top views of various shapes for partial windings of the interleaved on-chip differential inductor. These shapes also apply to the on-chip transformer.
Figure 9:
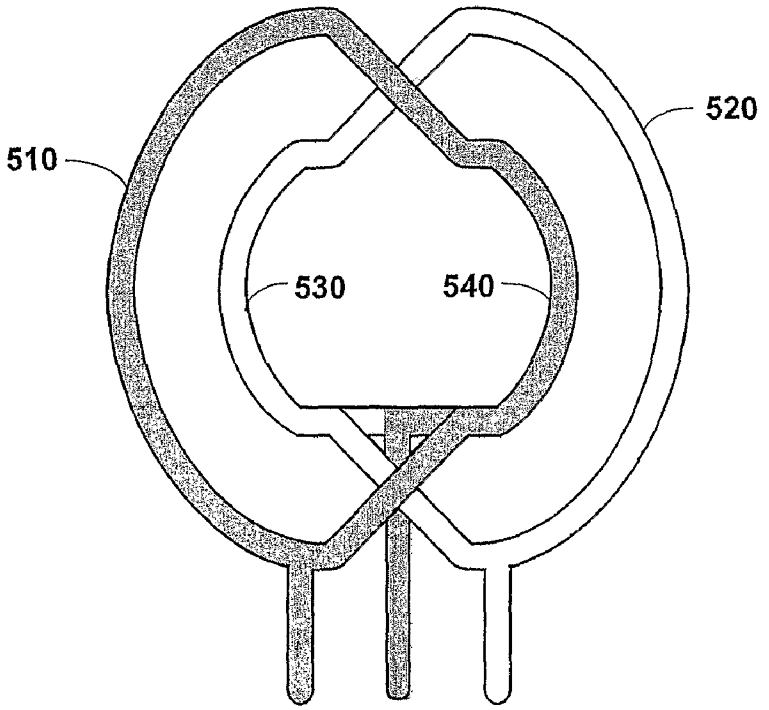

FIGS. 8 and 9 show top views, similar to that of FIG. 3, of alternative shapes for the partial windings for the interleaved on-chip differential inductor. The winding shapes also apply to on-chip transformers. FIG. 8 shows partial windings 410, 420, 430, and 440 that have a generally more rounded shape than the partial windings shown in FIGS. 1-3. FIG. 9 shows partial windings 510, 520, 530, and 540 that have an even more rounded shape than the partial windings 410, 420, 430, and 440 shown in FIG. 8.

A rounded shape is preferable because it offers the shortest length or periphery for the same area enclosed, which gives a lower metal loss caused by finite resistance and the skin effect, thus resulting in higher Q-factor. This also provides the highest magnetic flux, resulting in higher inductance. FIG. 8, however, shows a configuration that may be easier to build.

The resonant frequency (fo) is determined by $$f_0 = \frac{1}{2\pi}\frac{1}{\sqrt{LC}}$$

where C includes the capacitance of the inductor/transformer. L is the inductance of the inductor/transformer. The self-resonant frequency therefore is inversely proportional to the square root of the capacitance. Decreasing the capacitance overall increases the self-resonant frequency. A higher self-resonant frequency allows a device to operate at higher frequencies.

The coupling coefficient approaches its maximum value at the resonant frequency f0.

Controlling the capacitance of the inductor/transformer may be accomplished by designs that reduce the parasitic capacitance of the device, as described above. The capacitance may also be changed as needed by adding a varactor(s) in parallel with the inductor/transformer and thereby control the self-resonant frequency.

Figure 10:
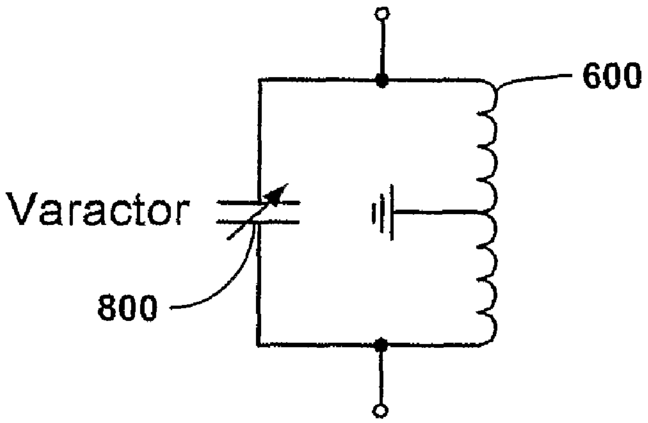
FIG. 10 shows a diagram of a circuit of a interleaved on-chip differential inductor provided with a variable capacitor in order to tune the resonant frequency.
Figure 11:
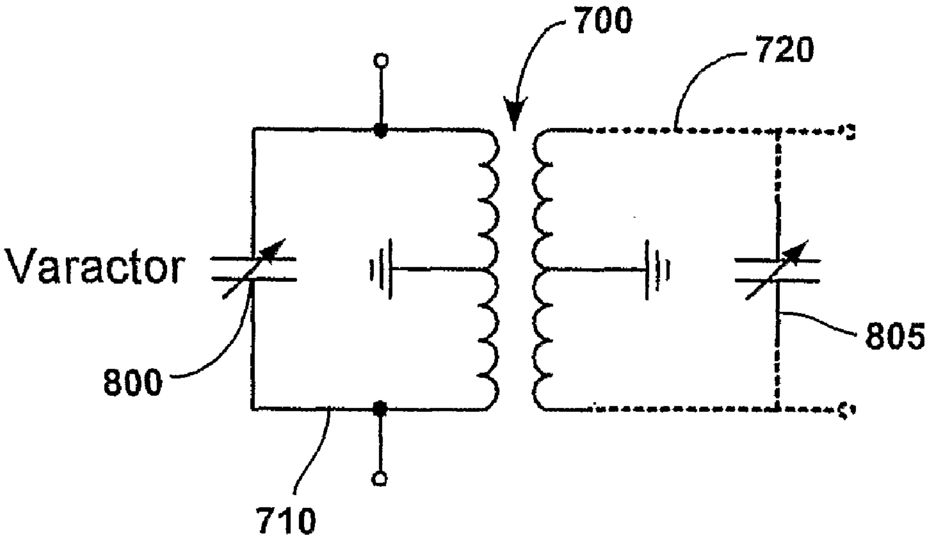
FIG. 11 shows a diagram of a circuit of a interleaved on-chip transformer provided with a variable capacitor in order to tune the resonant frequency.

Thus, interleaved 3D on-chip differential inductors and transformers may be provided with varactors (e.g., diodes or transistors) in order to have a resonant frequency that may be tuned by changing the varactor bias. Circuit diagrams of an interleaved 3D on-chip differential inductor 600 and an interleaved 3D on-chip transformer 700 in parallel with a varactor 800 are shown in FIGS. 10 and 11, respectively.

For transformers, the varactor 800 can be put at either the input or the output end or both. In FIG. 11 this is indicated by showing a varactor 800 in parallel with the input side 710 of the transformer 700 while the varactor 805 may or may not be in parallel with the output side 720 of the transformer 700, as shown by making the lines connecting the varactor 805 dashed lines. The varactor 800 may be removed from the input side 710 and only a varactor 805 provided on the output side 720.

The applicants have both simulated and implemented in silicon interleaved 3D on-chip differential inductors and transformers and applied them to the design of the low noise amplifier (LNA), mixer, coupled VCO arrays, and frequency dividers.

Interleaved 3D on-chip transformers according to the disclosure have been built with a winding width in the range 2~10 μm and a gap between windings (in the same layer) in the range 0.5~2 μm. The real estate occupied by the transformers was in the range 20×20 $\mu m^2$ to 40×40 $\mu m.^2$ Compared to a conventional on-chip transformer, a transistor with multilayer interleaved geometry shrinks the size typically by a factor of 50 to 100.

The self resonant frequency of these transformers was greater than 100 GHz. The self-resonant frequency of a conventional on-chip transformer is below 20 GHz.

Figure 12:
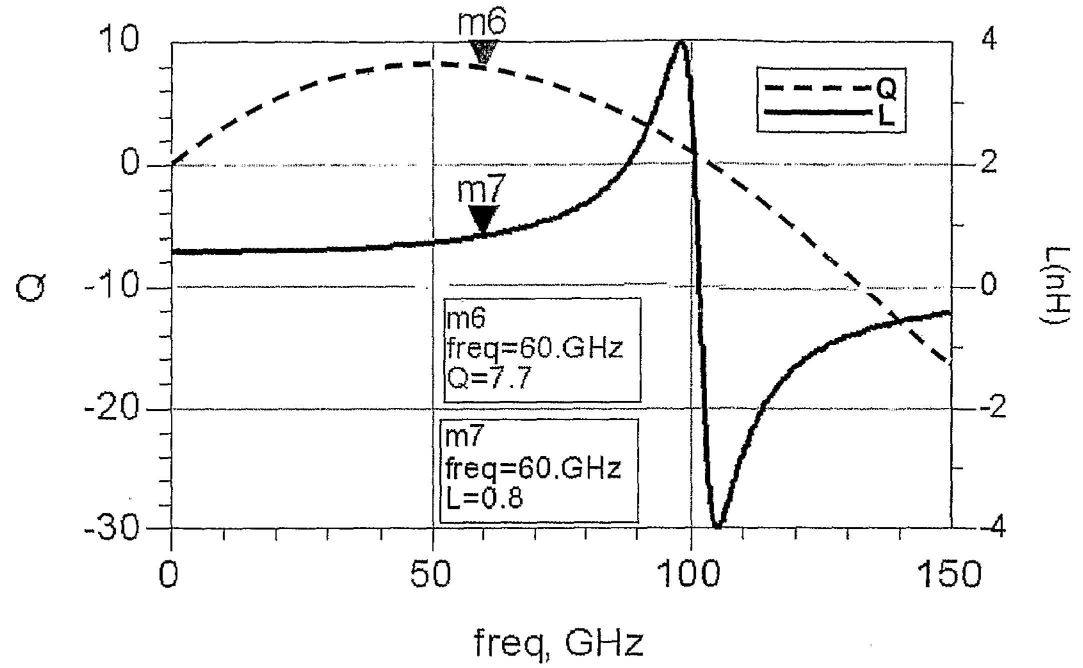
FIG. 12 is a graph of the quality factor and the inductance as a function of the frequency for a transformer made according to the disclosure.
Figure 13:
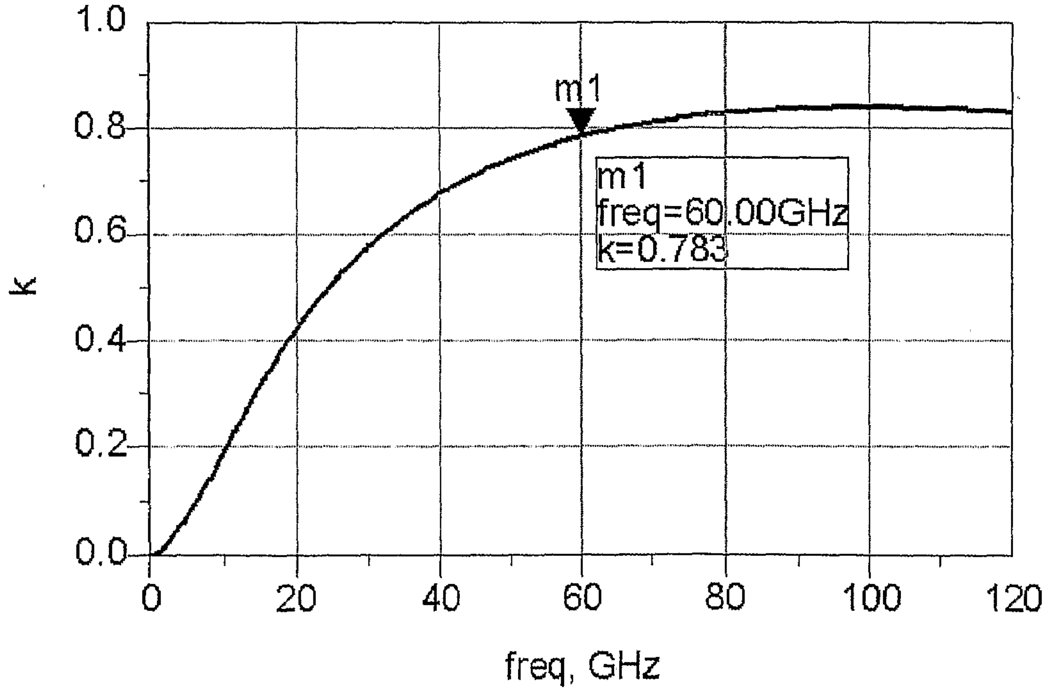
FIG. 13 is a graph of the coupling coefficient as a function of the frequency for a transformer made according to the disclosure.

FIGS. 12 and 13 show graphs of the performance of an interleaved 3D on-chip transformer having a real estate value of 20×20 $\mu m^2$, as calculated by a simulation program. The quality factor (Q) and the inductance (L) are plotted as a function of frequency in FIG. 12.

In FIG. 13 the coupling coefficient (k) is plotted as a function of frequency. The coupling coefficient is obtained from $$M=k\sqrt{L_1L_2}$$

where, $L_1$ is the inductance of the first inductor, and $L_2$ is the inductance of the second inductor, and M is the mutual inductance of the two inductors calculated by the double integral formula $$M_{ij}=\frac{\mu_0}{4\pi}\oint_{C_i}\oint_{C_j}\frac{ds_i\cdot ds_j}{|R_{ij}|}$$

in which i and j refer to the two circuits whose mutual inductance is to be calculated, μo is the permeability of vacuum, and the remainder of the terms refer to the geometry of the circuits, inductance being a purely geometrical quantity independent of the current in the circuits.

It will be noted that the coupling coefficient reaches a maximum at about 100 GHz when the inductance reaches zero. An operating frequency of about 60 GHz will enjoy a high and relatively linear and flat inductance and a maximum quality factor. This is an operating frequency well above those of conventional on-chip transformers.

The interleaved 3D on-chip inductors and transformers that are disclosed herein provide the following benefits:

1. miniature size which consumes very small chip real estate;

2. less parasitic capacitances between the inductor and the substrate and among windings of the inductor and transformer itself;

3. large inductance which increases the Q factor inductance product;

4. high coupling efficiency between the primary and the secondary coil of on-chip transformers;

5. very high self-resonating frequency which is desirable in high frequency applications;

6. a symmetrical structure which is inherently compatible with differential circuits; and 7. the transformers induce less phase mismatch errors in quadrature circuits than two un-correlated inductors.

To summarize, interleaving the windings in accordance with the present disclosure provides higher magnetic coupling and lower electrical coupling or parasitics, provides higher self resonant frequency allowing for higher frequency operation, consumes less chip area (and thus lowers manufacturing costs) due to the more compact size, and offers reduces phase mismatch due to the symmetrical geometry.

While illustrative embodiments of the circuits and methods disclosed herein have been shown and described in the above description, numerous variations and alternative embodiments will occur to those skilled in the art and it should be understood that, within the scope of the appended claims, the invention may be practised otherwise than as specifically described. Such variations and alternative embodiments are contemplated, and can be made, without departing from the scope of the invention as defined in the appended claims.

What is claimed is:

1. An inductive 3D on-chip apparatus comprising:

a first coil and a second coil disposed separately across multiple layers;

wherein said first and second coils each comprise successively connected partial windings centered on a common axis;

wherein the partial windings of the first coil are interleaved on successive layers of said multiple layers with the partial windings of the second coil; and wherein said first coil and said second coil each comprise partial windings which alternate between a first average diameter and a second average diameter across said multiple layers in relation to said common axis to separate said adjacent partial windings both vertically and horizontally;

wherein said first average diameter and said second average diameter have different values.

2. The inductive 3D on-chip apparatus as recited in claim 1, wherein the windings of the first coil are not aligned in the direction of the common axis with adjacent windings of the second coil.

3. The inductive 3D on-chip apparatus as recited in claim 1, wherein the first coil and the second coil each have a first end and a second end, the second end of the first coil and the second end of the second coil being connected to a first center tap, the first end of the first coil is a first port and the first end of the second coil is a second port.

4. The inductive 3D on-chip apparatus as recited in claim 3, wherein the apparatus is an interleaved three dimensional on-chip differential inductor.

5. The inductive 3D on-chip apparatus as recited in claim 1, further comprising third and fourth coils, the third and fourth coils comprising successively connected windings centered on the common axis, wherein the windings of the third coil are interleaved with the windings of the fourth coil, the third coil and the fourth coil each have a first end and a second end, the second end of the third coil and the second end of the fourth coil being connected to a second center tap, and the first end of the third coil is a third port and the first end of the fourth coil is a fourth port.

6. The inductive 3D on-chip apparatus as recited in claim 5, wherein the windings of the first coil are not aligned in the direction of the common axis with adjacent windings of the second coil.

7. The inductive 3D on-chip apparatus as recited in claim 6, wherein the windings of the third coil are not aligned in the direction of the common axis with adjacent windings of the fourth coil.

8. The inductive 3D on-chip apparatus as recited in claim 5, wherein the apparatus is an interleaved three dimensional on-chip transformer.

9. The inductive 3D on-chip apparatus as recited in claim 5, wherein the first center tap is a fifth port and the second center tap is a sixth port.

10. The inductive 3D on-chip apparatus as recited in claim 5, wherein the first and second center taps are connected to form a fifth port.

11. The inductive 3D on-chip apparatus as recited in claim 3, further comprising a variable capacitor operatively connected in parallel with the first and second ports.

12. The inductive 3D on-chip apparatus as recited in claim 5, further comprising a variable capacitor operatively connected in parallel with the first and second ports.

13. The inductive 3D on-chip apparatus as recited in claim 12, further comprising a variable capacitor operatively connected in parallel with the third and fourth ports.

14. An interleaved three dimensional on-chip differential inductor, comprising:

first and second coils formed on a plurality of layers on a chip and sharing a common alignment axis, each of the first and second coils comprising a plurality of partial windings wherein each partial winding is disposed on a layer with connections between successive partial windings of each of the first and second coils passing through the layers; and wherein the partial windings of the first and second coils are generally perpendicular to the common alignment axis and are interleaved; and wherein said partial windings of said first and second coils alternate between a first average diameter and a second average diameter across said multiple layers in relation to said common axis to separate said adjacent partial windings both vertically and horizontally;

wherein said first average diameter and said second average diameter have different values.

15. The interleaved three dimensional on-chip differential inductor as recited in claim 14, wherein each partial winding of the first coil is disposed on a layer with a partial winding of the second coil.

16. The interleaved three dimensional on-chip differential inductor as recited in claim 15, wherein each partial winding disposed on a layer defines part of the shape of a simple polygon or a simple closed curve.

17. The interleaved three dimensional on-chip differential inductor as recited in claim 16, wherein the partial winding of the first coil and the partial winding of the second coil disposed on a layer generally define the shape of a simple polygon or a simple closed curve.

18. The interleaved three dimensional on-chip differential inductor as recited in claim 17, wherein the area of the simple polygon or a simple closed curve defined by the partial windings on a layer is larger or smaller than the area of the simple polygon or a simple closed curve defined by the partial windings on adjacent layers.

19. The interleaved three dimensional on-chip differential inductor as recited in claim 14, wherein the connections between successive partial windings of a coil are vias.

20. The interleaved three dimensional on-chip differential inductor as recited in claim 14, wherein the first coil and the second coil each have a first end and a second end, the second end of the first coil and the second end of the second coil being connected to a center tap, the first end of the first coil is a first port and the first end of the second coil is a second port.

21. An interleaved three dimensional on-chip transformer, comprising:

first and second coils formed on a plurality of layers on a chip and sharing a common alignment axis, each of the first and second coils comprising a plurality of partial windings wherein each partial winding is disposed on a layer with connections between successive partial windings of each of the first and second coils passing through the layers separating the successive partial windings of each of the first and second coils;

wherein the partial windings of the first and second coils are generally perpendicular to the common alignment axis and are interleaved;

third and fourth coils formed on the plurality of layers of the chip and sharing the common alignment axis, each of the third and fourth coils comprising a plurality of partial windings wherein each partial winding is disposed on a layer with connections between successive partial windings of each of the third and fourth coils passing through the layers separating the successive windings of each of the third and fourth coils; and wherein the partial windings of the third and fourth coils are generally perpendicular to the common alignment axis and are interleaved; and wherein said partial windings of said first, second, third and fourth coils alternate between a first average diameter and a second average diameter across said multiple layers in relation to said common axis to separate said adjacent partial windings both vertically and horizontally;

wherein said first average diameter and said second average diameter have different values.

22. The interleaved three dimensional on-chip transformer as recited in claim 21, wherein a partial winding of the first coil is disposed on a layer with a partial winding of the second coil.

23. The interleaved three dimensional on-chip transformer as recited in claim 22, wherein partial windings of the first, second, third, and fourth coils are disposed on at least one layer.

24. The interleaved three dimensional on-chip transformer as recited in claim 22, wherein partial windings of the first, second, third, and fourth coils are disposed on each of the layers having partial windings disposed thereon.

25. The interleaved three dimensional on-chip transformer as recited in claim 22, wherein a partial winding of the third coil is disposed on a layer with a partial winding of the fourth coil.

26. The interleaved three dimensional on-chip transformer as recited in claim 25, wherein the partial windings of the first and second coils and the partial windings of the third and fourth coils are disposed on alternate layers.

27. The interleaved three dimensional on-chip transformer as recited in claim 21, wherein each partial winding disposed on a layer defines part of the shape of a simple polygon or a simple closed curve.

28. The interleaved three dimensional on-chip transformer as recited in claim 21, wherein the partial winding of the first coil and the partial winding of the second coil disposed on a layer generally define the shape of a simple polygon or a simple closed curve.

29. The interleaved three dimensional on-chip transformer as recited in claim 28, wherein the partial winding of the third coil and the partial winding of the fourth coil disposed on a layer generally define the shape of a simple polygon or a simple closed curve.

30. The interleaved three dimensional on-chip transformer as recited in claim 29, wherein the area of the simple polygon or a simple closed curve defined by the partial windings of the first coil and second coils on a layer is larger or smaller than the area of the simple polygon or a simple closed curve defined by the nearest partial windings of the first and second coils.

31. The interleaved three dimensional on-chip transformer as recited in claim 29, wherein the area of the simple polygon or a simple closed curve defined by the partial windings of the third coil and fourth coils on a layer is larger or smaller than the area of the simple polygon or a simple closed curve defined by the nearest partial windings of the third and fourth coils.

32. The interleaved three dimensional on-chip transformer as recited in claim 21, wherein the connections between successive partial windings of a coil are vias.

33. The interleaved three dimensional on-chip transformer as recited in claim 21, wherein the first coil and the second coil each have a first end and a second end, the second end of the first coil and the second end of the second coil being connected to a first center tap, the first end of the first coil is a first port and the first end of the second coil is a second port, the third coil and the fourth coil each have a first end and a second end, the second end of the third coil and the second end of the fourth coil being connected to a second center tap, the first end of the third coil is a third port and the first end of the fourth coil is a second port.

34. The interleaved three dimensional on-chip transformer as recited in claim 33, wherein the first center tap is a fifth port and the second center tap is a sixth port.

35. The interleaved three dimensional on-chip transformer as recited in claim 33, wherein the first center tap and the second center tap are connected to be a fifth port.

36. A method for making three-dimensional on-chip differential inductors and transformers, comprising:

forming a substrate in multiple successive layers on a chip;

disposing two partial windings on each layer, the partial windings having a common axis and forming the shape of a simple polygon or a simple closed curve whose average diameter alternates between a first average diameter and a second average diameter on adjacent layers;

wherein said first average diameter and said second average diameter have different values;

connecting each of the partial windings disposed on one of the layers to one of the partial windings of an adjacent layer;

wherein the partial windings of one layer are disposed so as to be interleaved with the partial windings of adjacent layers.

37. The method for making three-dimensional on-chip differential inductors and transformers as recited in claim 36, wherein the step of disposing partial windings on each layer comprises disposing four partial windings on each layer, the partial windings having a common axis and being arranged in pairs of partial windings wherein each pair of partial windings forms the shape of a simple polygon or a simple closed curve.

* * * * *